United States Patent
Wolford et al.

(10) Patent No.: US 7,195,058 B2
(45) Date of Patent: Mar. 27, 2007

(54) HEAT SINK MADE FROM A SINGLY EXTRUDED HEATPIPE

(75) Inventors: Robert Russell Wolford, Raleigh, NC (US); Jimmy Grant Foster, Sr., Morrisville, NC (US); Donna Casteel Hardee, Raleigh, NC (US); Don Steven Keener, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 11/000,583

(22) Filed: Dec. 1, 2004

(65) Prior Publication Data

US 2006/0113065 A1   Jun. 1, 2006

(51) Int. Cl.
  *F28D 15/00* (2006.01)
  *F28F 7/00* (2006.01)
  *H05K 7/20* (2006.01)
(52) U.S. Cl. ................ 165/104.21; 165/80.3
(58) Field of Classification Search ............... 165/80.3, 165/104.21, 104.26, 104.33, 104.34; 361/697–700, 361/703; 257/714–715; 174/15.2, 16.3
See application file for complete search history.

(56) References Cited

U.S. PATENT DOCUMENTS

| | | | | |
|---|---|---|---|---|
| 3,182,114 A | * | 5/1965 | Burgess et al. | 174/16.3 |
| 4,116,266 A | * | 9/1978 | Sawata et al. | 165/104.26 |
| 4,588,023 A | * | 5/1986 | Munekawa | 165/104.33 |
| 6,535,385 B2 | * | 3/2003 | Lee | 361/697 |
| 6,633,484 B1 | * | 10/2003 | Lee et al. | 361/697 |
| 6,657,862 B2 | * | 12/2003 | Crocker et al. | 361/697 |
| 2001/0048397 A1 | | 12/2001 | Smith | |
| 2003/0066628 A1 | | 4/2003 | Mochizuki et al. | |
| 2003/0131970 A1 | * | 7/2003 | Carter et al. | 165/80.3 |
| 2003/0192671 A1 | | 10/2003 | Lee et al. | |

FOREIGN PATENT DOCUMENTS

| EP | 0 612 617 A1 | 8/1994 |
|---|---|---|
| JP | 3-156294 | 4/1991 |

* cited by examiner

*Primary Examiner*—Tho Duong
(74) *Attorney, Agent, or Firm*—Martin J. McKinley; Cynthia S. Byrd; Dillon & Yudell LLP

(57) ABSTRACT

A heatpipe for cooling an integrated circuit. The heatpipe includes a pipe and radial fins that are formed by extruding a single piece of material, such as heat conducting metal. Each of the radial fins extends away from the pipe and runs (preferably) the length of the pipe. Each radial fin has normally oriented subfins that provide additional heat convection surface areas to the radial fins. Within the pipe are interior fins, also formed during the material extrusion process. The interior fins provide additional conduction cooling to a heat transferring fluid circulating within the pipe.

14 Claims, 6 Drawing Sheets

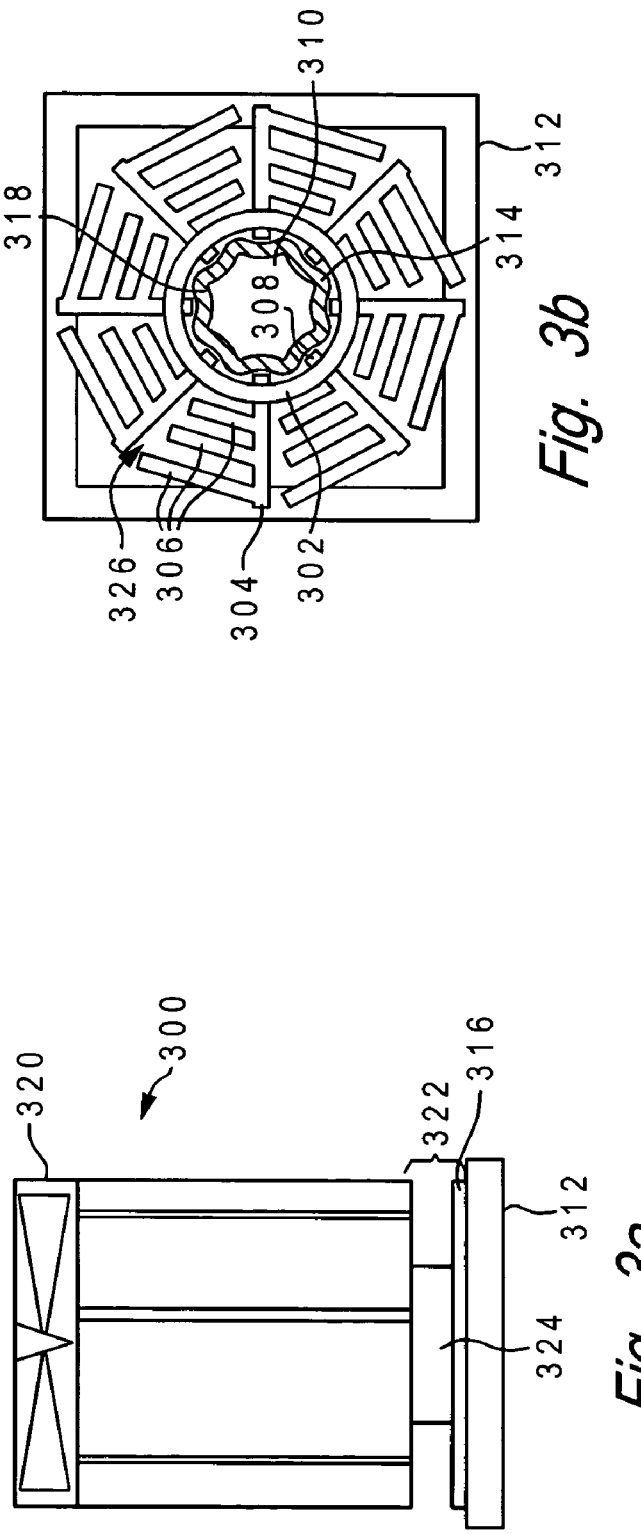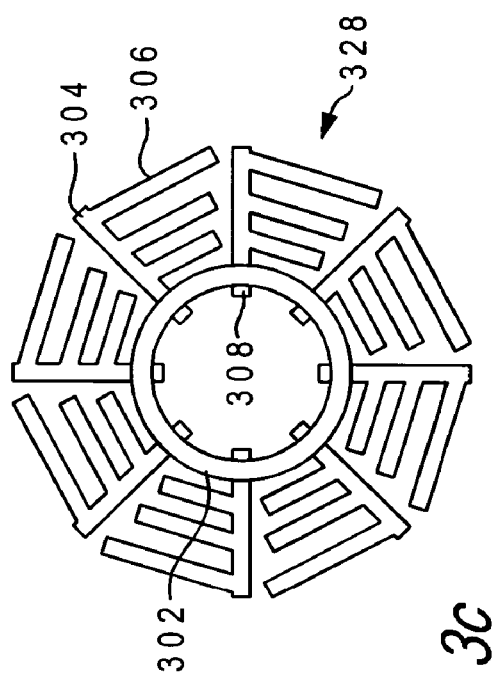

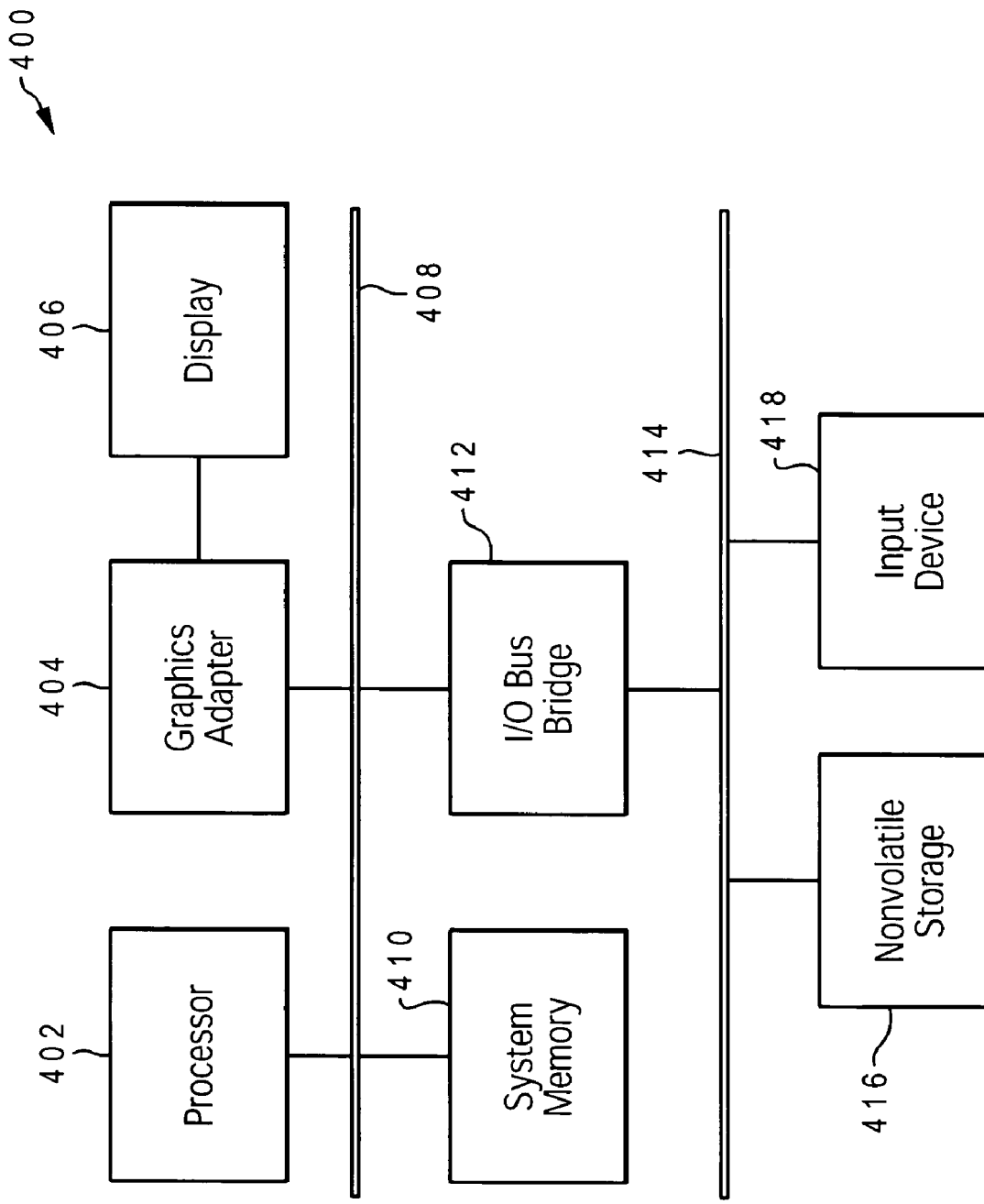

HEAT SINK MADE FROM A SINGLY EXTRUDED HEATPIPE

BACKGROUND OF THE INVENTION

1. Technical Field

The present invention relates in general to the field of electronics, and in particular to the removal of extraneous heat from electronic chips. More particularly, the present invention relates to a functional design and method of manufacture of a heat sink having a heatpipe.

2. Description of the Related Art

In a typical personal computer (PC), the main heat-generating component among the logic circuits is the processor, also referred to as the Central Processing Unit (CPU) or microprocessor (MP). As illustrated in FIG. 1a, a processor 102 is mounted in a socket 104, which is mounted on a (printed) circuit board 106, by mating pins 108 from the processor 102 into the socket 104. As processors continue to grow in performance, so does the heat generated by the processors. This heat, if excessive, can cause the processor 102, or any other similar Integrated Circuit (IC) package, to malfunction or fail entirely.

To remove heat from processor 102, a heat sink (HS) 110, having a HS base 112 and a plurality of fins 114, is secured to processor 102 by a strap 116 or other attachment means. Heat is conducted from the processor 102 to the HS base 112 and the fins 114, which dissipate heat by conduction and convection to ambient air surrounding fins 114. To provide thermal conduction between a top surface 120 of processor 102 and the HS base 112, a thermal grease 118, typically a thermally conductive silicon or filled hydrocarbon grease doped with fillings such as metals, is used.

A major problem with the heat sink 110 shown in FIG. 1a is that it relies on conduction to the ambient air, which may or may not be moving enough to significantly convey away heat, depending on movement of air about the heat sink caused by fan(s) in a computer case that houses the processor 102. To aid in this air movement, the prior art provided the improvement of a heat sink fan 122, as shown in FIG. 1b. As shown, heat sink fan 122 includes fan blades 124 that rotate about a hub 126.

As IC's became even denser with more and more transistors and other electronic components, the heat sink configurations shown in FIGS. 1a–b became insufficient to remove damaging heat from IC packages such as that shown for processor 102. The next step-up in prior art heat removal technology was the development of a heat sink that incorporated a pipe filled with a heat-transferring fluid. This type of heat sink is known as a "heatpipe." With reference now to FIG. 2a, a prior art heatpipe 200 is depicted. Heatpipe 200 is composed of a heatpipe base 202, which is adjacent to processor 102, with or without intermediary thermal grease 118. As shown in FIGS. 2a–c, attached to heatpipe base 202 is a pipe 204, from which a plurality of horizontal fins 206 extends. Horizontal fins 206 convectively remove heat away from pipe 204, in a manner similar to that described for fins 114 described in FIGS. 1a–b. However, heatpipe 200 utilizes fluid heat transfer as well.

As shown in FIG. 2c, pipe 204 is filled with a fluid 208, which is retained inside of pipe 204 by a pipe cap 210. As depicted by the flow arrows in FIG. 2c, fluid 208 circulates in a vertical manner within pipe 204. That is, as fluid 208 is heated at the bottom of pipe 204, which is adjacent heatpipe base 202 and thus the heat producing processor 102, fluid 208 rises upwards towards a pipe cap 210 at the top of pipe 204. When fluid 208 reaches pipe cap 210, fluid 208 flows back down the interior sides of pipe 204. The sides of pipe 204 are able to conduct away heat from fluid 208, since the horizontal fins 206 provide additional conduction/convection cooling from the sides of pipe 204 to the ambient air.

While the heatpipe 200 depicted in FIGS. 2a–c was a great improvement over prior art heat sinks, the construction of heatpipe 200 is cumbersome. Each component of heatpipe 200 must be individually fabricated, and the entire heatpipe 200 then assembled. That is, heatpipe base 202, pipe 204, horizontal fins 206 and pipe cap 210 must each be separately fabricated, and then the pieces are bonded together to form the final heatpipe 200. One of the most onerous steps in the fabrication/assembly process for heatpipe 200 is the attachment of horizontal fins 206 to pipe 204. After aligning each of the horizontal fins 206 with pipe 204, the horizontal fins 206 are bonded (usually with heat welding or a similar process) to pipe 204. This process is expensive, time consuming, and difficult to meet quality control parameters.

What is needed therefore is a device and method of manufacture for a heatpipe that is cheaper, faster, and easier to meet quality control standards.

SUMMARY OF THE INVENTION

The present invention is therefore directed to a heatpipe for cooling an integrated circuit. The heatpipe includes a pipe and radial fins that are formed by extruding a single piece of material, such as heat conducting metal. Each of the radial fins extends away from the pipe and (preferably) runs the length of the pipe. Each radial fin has normally oriented subfins that provide additional heat convection surface areas to the radial fins. Within the pipe are interior fins, also formed during the material extrusion process. The interior fins provide additional conduction cooling to a heat transferring fluid circulating within the pipe.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIGS. 3a–b illustrate the inventive heatpipe;

FIG. 3c depicts a single extrusion used to fabricate the inventive heatpipe; and FIG. 4 illustrates an exemplary computer system in which the inventive heatpipe may be incorporated.

DETAILED DESCRIPTION OF A PREFERRED EMBODIMENT

Figure 1A:
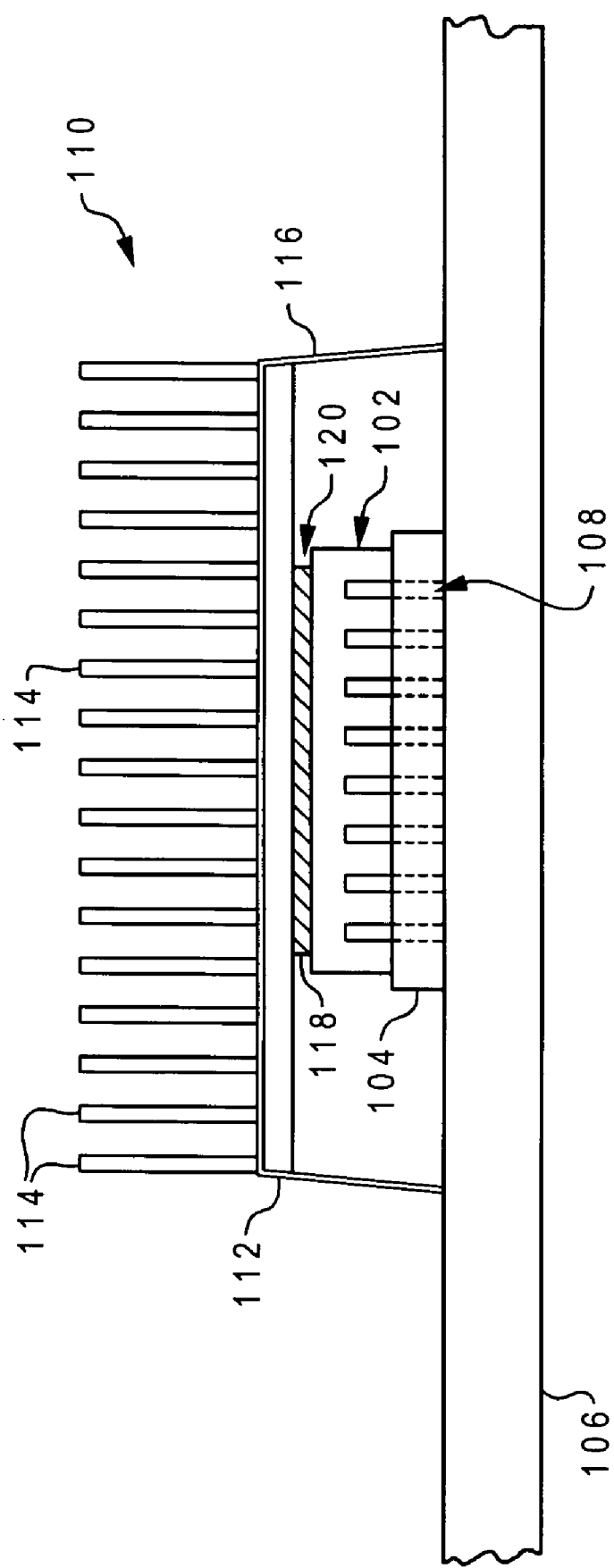
FIGS. 1a–b depict a prior art heat sink.
Figure 1B:
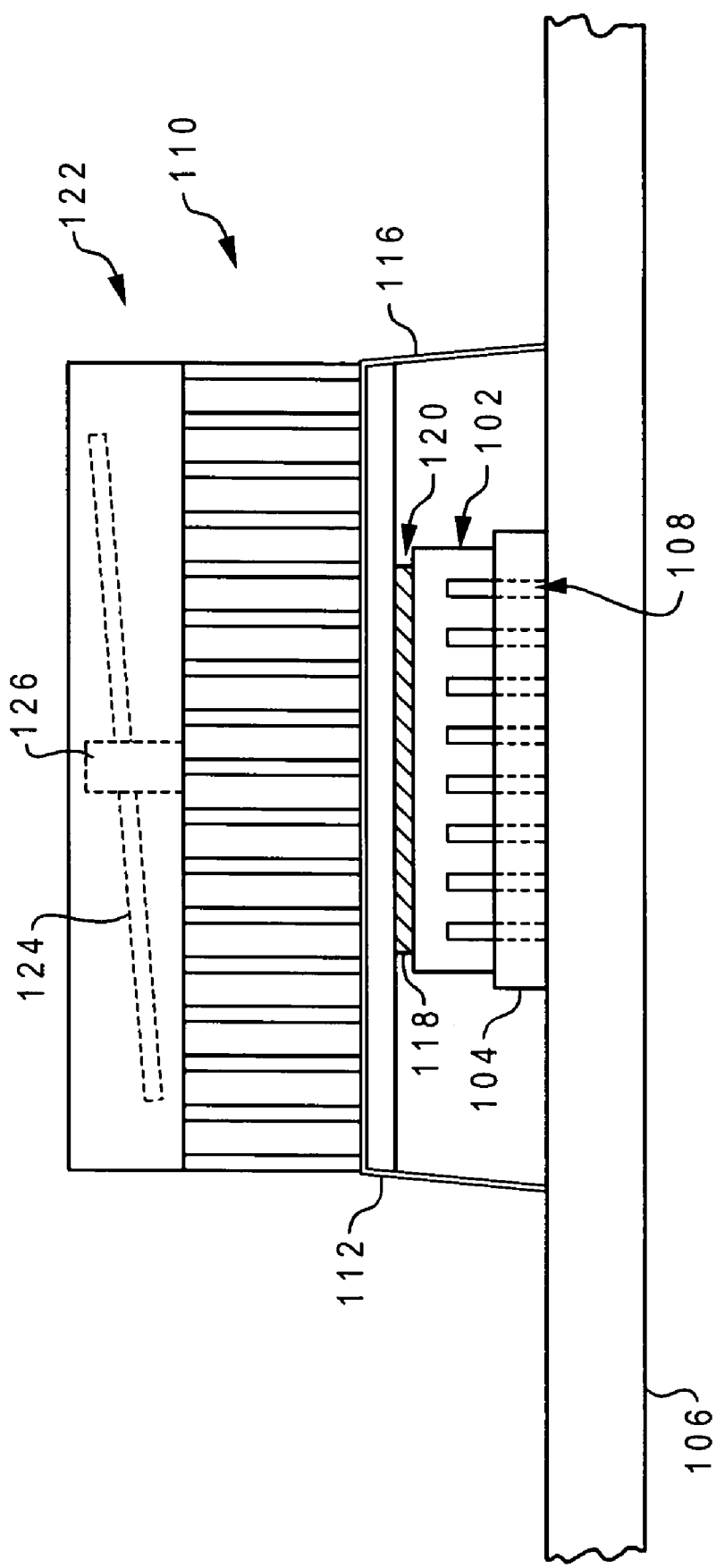

With reference now to FIGS. 3a–b, there is depicted a novel heatpipe 300. Heatpipe 300 is made up of a pipe 302, from which multiple external fins 304 extend. The external fins 304 are oriented longitudinally along the sides of pipe 302 as shown in FIG. 3a.

Each external fin 304 has a plurality of subfins 306, which are preferably extended away from the external fins 304 in a generally normal orientation, such that the external fins 304 and subfins 306 form a pinwheel shape around pipe 302 as depicted.

Figure 2A:
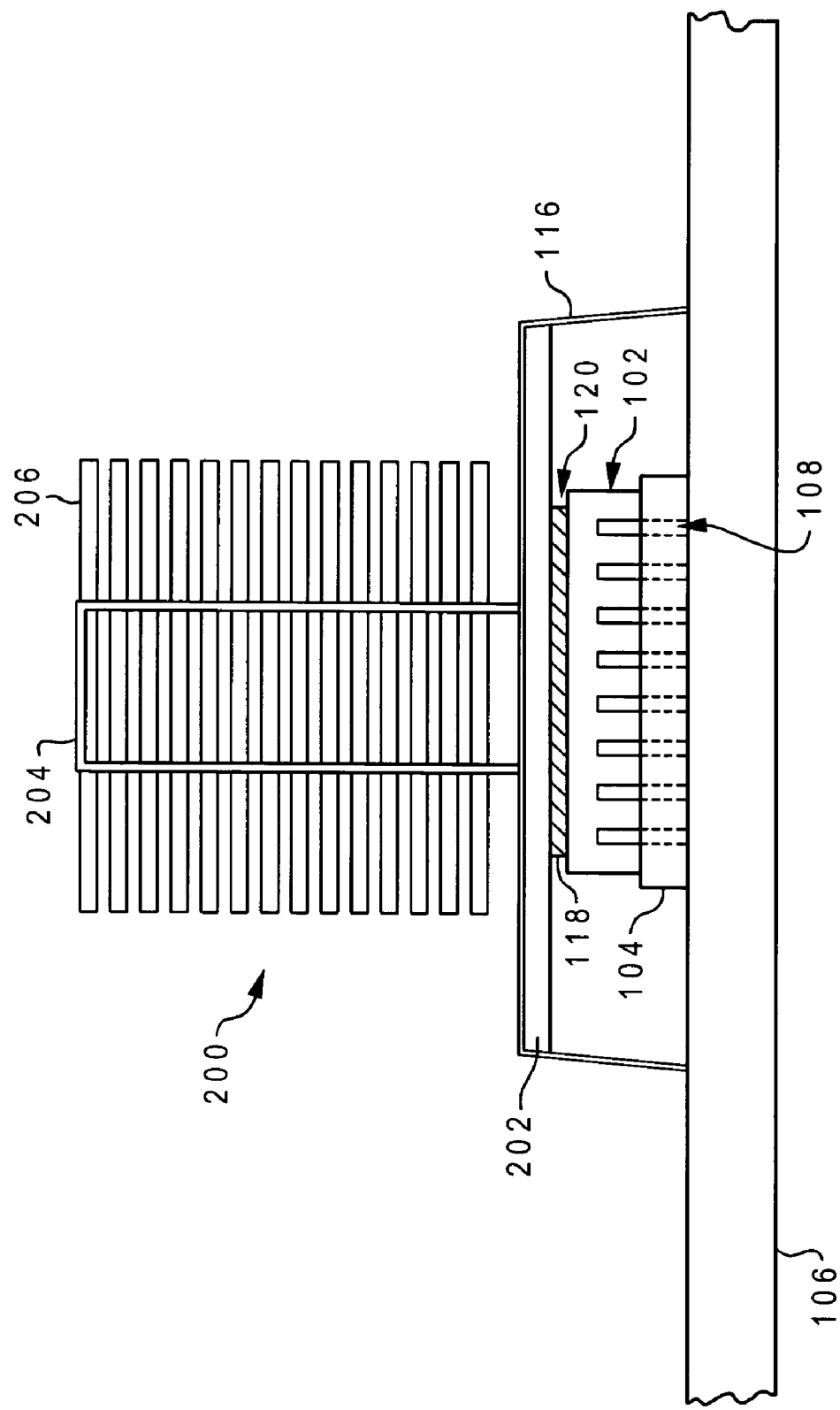
FIGS. 2a–c depict a prior art heatpipe.
Figure 2C:
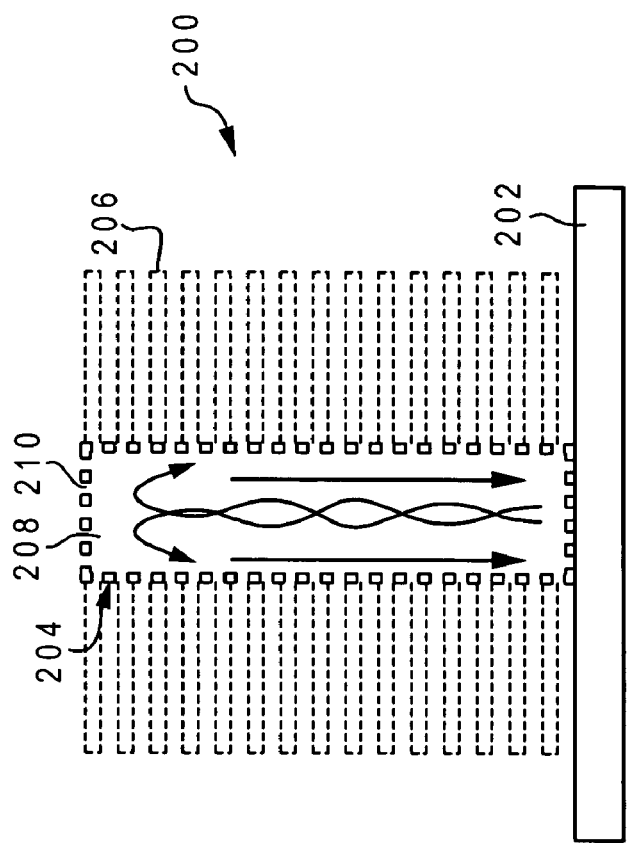
Figure 2B:
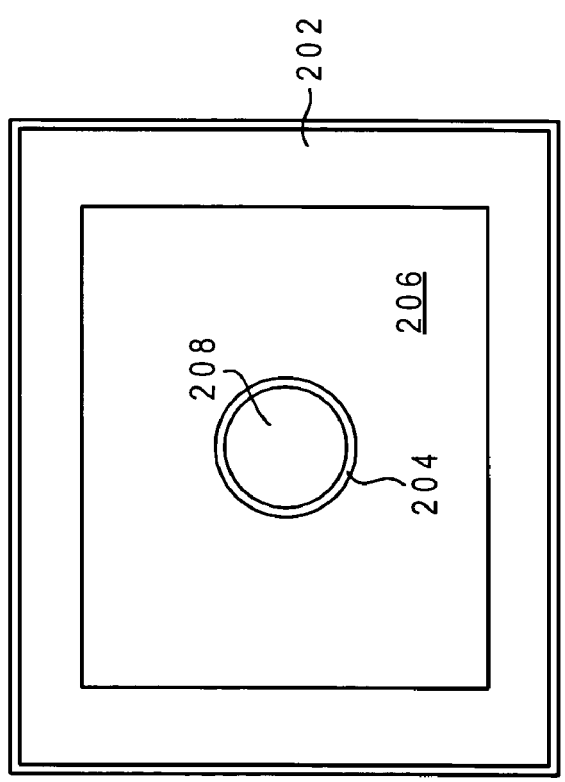

Within the interior of pipe 302 are interior fins 308, which run along the entire interior length of pipe 302 just as external fins 304 run longitudinally along the entire exterior length of pipe 302. In the middle of pipe 302 is a vapor chamber 310, through which a cooling fluid can travel upwards away from a heat source, such as an Integrated Circuit (IC) package 312 that is within a system such as a computer system shown below in FIG. 4. As the cooling fluid travels upwards through the vapor chamber 310, the cooling fluid is drawn towards the space about interior fins 308 by a wicking material 314. The cooling fluid is contained within pipe 302 by fusing (or otherwise attaching) a base 316 at a first end of pipe 302 and a pipe cap 318 at a second end of pipe 302. Thus, the cooling fluid circulates within pipe 302 in a manner similar to that shown in pipe 204 in FIG. 2c, except that the wicking material 314 provides an additional cooling aid from the drawing of the cooling material towards the cooled interior sides of pipe 302.

Optionally, a fan 320 is mounted above heatpipe 300, to facilitate in the movement of air past external fins 304 and subfins 306. To provide an air gap 322 for an additional amount of air inlet space, a base spacer ring 324 is optionally attached between the lower end of pipe 302 and base 316. Note that base spacer ring 324 attaches to an opened end (not shown) of pipe 302 to permit movement of the cooling fluid to reach base 316.

Alternatively, pipe 302 attaches directly to base 316, without an intervening base spacer ring 324, in order to make fabrication of heatpipe 300 easier. However, if base spacer ring 324 is not included, then care should be taken to ensure that adequate airflow reaches subfins 306, such as through passages 326 shown in FIG. 3b. Alternatively, the lower portions of extruded external fins 304 can be machined (preferably milled) down, to create air gap 322 without the need for a base spacer ring 324. Thus, by simply milling down the lower portions of the extruded external fins 304, either before or after being mounted to base 316, fewer parts need to be welded together (since base spacer ring 324 is not needed).

With reference now to FIG. 3c, a single extrusion 328 is depicted, which includes pipe 302, external fins 304, subfins 306, and internal fins 308. During the fabrication of heatpipe 300, single extrusion 328 is formed by extruding a single piece of material, preferably metal, resulting in the cross-sectional shape shown in FIG. 3c. The extrusion process is any material extrusion process known to those skilled in the art of material extrusion.

The single extrusion 328 is then cut and mounted (preferably using heat fusion) to base 316. Wicking material 314 is inserted into the interior of pipe 302, which is then evacuated and filled with a cooling fluid. Pipe 302 is then capped by fusing pipe cap 318 to the top end of pipe 302.

With reference now to the FIG. 4, there is depicted a block diagram of an exemplary data processing system that may incorporate heatpipe 300 for cooling purposes, including the cooling of a central processing unit such as a depicted central processing unit 402.

Data processing system 400 may be, for example, one of the models of personal or server computers available from International Business Machines Corporation of Armonk, N.Y. Data processing system 400 includes a central processing unit (CPU) 402, which is connected to a system bus 408. In the exemplary embodiment, data processing system 400 includes a graphics adapter 404 also connected to system bus 408, for providing user interface information to a display 406.

Also connected to system bus 408 are a system memory 410 and an input/output (I/O) bus bridge 412. I/O bus bridge 412 couples an I/O bus 414 to system bus 408, relaying and/or transforming data transactions from one bus to the other. Peripheral devices such as nonvolatile storage 416, which may be a hard disk drive, and input device 418, which may include a conventional mouse, a trackball, or the like, is connected to I/O bus 414.

The exemplary embodiment shown in FIG. 4 is provided solely for the purposes of explaining the invention and those skilled in the art will recognize that numerous variations are possible, both in form and function. For instance, data processing system 400 might also include a compact disk read-only memory (CD-ROM) or digital versatile disk (DVD) drive, a sound card and audio speakers, and numerous other optional components. All such variations are believed to be within the spirit and scope of the present invention.

By using a single piece of extruded material to form the pipe and fins of a heatpipe, fabrication time is greatly reduced while quality is increased, since individual fins do not have to be fused to the pipe. Likewise, without extruding the pipe and fins as a single unit, it is difficult, if not infeasible, to have interior fins mounted to the interior of the pipe as described by the present invention.

While the invention has been particularly shown and described with reference to a preferred embodiment, it will be understood by those skilled in the art that various changes in form and detail may be made therein without departing from the spirit and scope of the invention. For example, the present invention may be useful with any heat generating device, besides the IC package described above.

Finally, note that while terms such as "bottom" and "top" have been used to describe the spatial orientation and movement of different components, such terms are used generically, and the present invention as described and claimed is to include orientations so generally described, but not limited to such "up/down" definitions.

What is claimed is:

1. A system comprising:
    a heatpipe having:
        a base oriented proximate to a heat producing integrated circuit package,
        a pipe having a first end connected to the base,
        a plurality of external fins oriented longitudinally along the sides of the pipe, wherein each of the external fins has multiple subfins that extend away from a face of the external fin in a substantially perpendicular orientation, and wherein each set of multiple subfins is oriented in a same circular direction to form a pinwheel shape,
        a heat-transferring fluid within the pipe, and
        a pipe cap sealing a second end of the pipe.

2. The system of claim 1, further comprising one or more internal fins attached longitudinally to an interior of the pipe, wherein each of the internal fins is a linearly-oriented extension of one of the external fins.

3. The system of claim 1, further comprising:
    a base spacer ring that is connected to the first end of the pipe, wherein the base spacer ring permits cooling fluid in the pipe to reach the base, and wherein the base spacer ring provides an air gap between the external fins and the base to create an additional amount of air inlet space for airflow across the external fins.

4. The system of claim 1, wherein each set of multiple subfins is made up of progressively larger subfins, such that a shortest subfin is oriented proximate to the pipe and a longest subfin is oriented distal to the pipe, thus creating the pinwheel shape.

5. The system of claim 1, wherein the fluid is a liquid, and wherein the system further comprises a wicking material oriented between the fluid and an interior wall of the pipe.

6. The system of claim 2, wherein the fluid is a liquid, and wherein the system further comprises a wicking material oriented between the fluid and the interior fins.

7. The system of claim 1, further comprising a fan oriented to move air across the external fins, wherein the fan is oriented to move air parallel to both the external fins and the subfins.

8. A heatpipe comprising:
a base capable of being oriented proximate to a heat producing integrated circuit package;
a pipe having a first end connected to the base;
a plurality of external fins oriented longitudinally along the sides of the pipe a plurality of external fins oriented longitudinally along the sides of the pipe, wherein each of the external fins has multiple subfins that extend away from a face of the external fin in a substantially perpendicular orientation, and wherein each set of multiple subfins is oriented in a same circular direction to form a pinwheel shape;
a heat-transferring fluid within the pipe; and
a pipe cap sealing a second end of the pipe.

9. The heatpipe of claim 8, further comprising one or more internal fins attached longitudinally to an interior of the pipe, wherein each of the internal fins is a linearly-oriented extension of one of the external fins.

10. The heatpipe of claim 8, further comprising:
a base spacer ring that is connected to the first end of the pipe, wherein the base spacer ring permits cooling fluid in the pipe to reach the base, and wherein the base spacer ring provides an air gap between the external fins and the base to create an additional amount of air inlet space for airflow across the external fins.

11. The heatpipe of claim 8, wherein each set of multiple subfins is made up of progressively larger subfins, such that a shortest subfin is oriented proximate to the pipe and a longest subfin is oriented distal to the pipe, thus creating the pinwheel shape.

12. The heatpipe of claim 8, wherein the fluid is a liquid, and wherein the system further comprises a wicking material oriented between the fluid and an interior wall of the pipe.

13. The heatpipe of claim 9, wherein the fluid is a liquid, and wherein the system further comprises a wicking material oriented between the fluid and the interior fins.

14. The heatpipe of claim 8, further comprising a fan oriented to move air across the external fins, wherein the fan is oriented to move air parallel to both the external fins and the subfins.

* * * * *